(12) United States Patent
Argawal et al.

(10) Patent No.: US 7,768,814 B2
(45) Date of Patent: Aug. 3, 2010

(54) METHOD AND APPARATUS FOR MEASURING STATISTICS OF DRAM PARAMETERS WITH MINIMUM PERTURBATION TO CELL LAYOUT AND ENVIRONMENT

(75) Inventors: Kanak B. Argawal, Austin, TX (US); Jerry D. Hayes, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 12/233,856

(22) Filed: Sep. 19, 2008

(65) Prior Publication Data
US 2010/0074040 A1      Mar. 25, 2010

(51) Int. Cl.
*G11C 11/24*       (2006.01)
(52) U.S. Cl. ........................ 365/149; 365/201
(58) Field of Classification Search ........................ None
See application file for complete search history.

(56) References Cited

U.S. PATENT DOCUMENTS

| | | | | |
|---|---|---|---|---|
| 5,831,895 A | * | 11/1998 | Manning | 365/149 |
| 6,069,817 A | * | 5/2000 | Shin et al. | 365/145 |
| 6,552,921 B2 | * | 4/2003 | Tsai et al. | 365/145 |
| 6,785,157 B2 | * | 8/2004 | Arimoto et al. | 365/149 |
| 7,460,422 B2 | * | 12/2008 | Bernstein et al. | 365/201 |
| 7,483,322 B2 | * | 1/2009 | Joshi et al. | 365/201 |
| 7,668,003 B2 | * | 2/2010 | Barth et al. | 365/149 |

* cited by examiner

*Primary Examiner*—Tan T. Nguyen
(74) *Attorney, Agent, or Firm*—Libby Z. Toub; Suiter Swantz pc llo

(57) ABSTRACT

The present invention provides a method for measuring statistics of dynamic random access memory (DRAM) process parameters for improving yield and performance of a DRAM. The basic principles for measuring capacitance are similar to charge based capacitance (CBCM), however the present invention differs in several fundamental aspects. In one embodiment, the method includes receiving a selection of a storage cell of the DRAM; measuring a storage cell capacitance ($C_{cell}$) of the storage cell; measuring a local bitline capacitance ($C_{bl}$) of the storage cell; measuring a transfer device voltage ($V_T$) of the storage cell; computing a transfer ratio (TR) for the storage cell; and measuring a data retention time for the storage cell.

20 Claims, 2 Drawing Sheets

METHOD AND APPARATUS FOR MEASURING STATISTICS OF DRAM PARAMETERS WITH MINIMUM PERTURBATION TO CELL LAYOUT AND ENVIRONMENT

FIELD OF THE INVENTION

The present invention is directed generally to DRAM cells, and, more particularly, monitoring process parameters related to dynamic random access memory (DRAM).

BACKGROUND OF THE INVENTION

The use of DRAM technology has become widespread, especially in higher end system designs, because of its superior performance, silicon-area savings, and low power compared with discrete-memory approaches. A highly integrated DRAM approach also simplifies board design, thereby reducing overall system cost and time to market. Even more important, embedding DRAM enables higher bandwidth by allowing larger on-chip memory and a wider on-chip bus and saves power by eliminating DRAM I/O buffers. Today, designers can take advantage of these capabilities as various high density DRAM technologies enter production. However, DRAM cells utilizing these technologies are susceptible to a large amount of process variation due to factors such as threshold voltage variation and mismatch. It is this process variation that creates limitations on the design and fabrication of the DRAM and the associated systems.

Thus, there is a need to provide monitoring for measuring statistics of important DRAM parameters in order to control the inherent process variation.

SUMMARY OF THE INVENTION

The present invention provides a method for measuring statistics of dynamic random access memory (DRAM) process parameters for improving yield and performance of a DRAM. In one embodiment, the method includes receiving a selection of a storage cell of the DRAM; measuring a storage cell capacitance ($C_{cell}$) of the storage cell; measuring a local bitline capacitance ($C_{bl}$) of the storage cell; measuring a transfer device voltage ($V_T$) of the storage cell; computing a transfer ratio (TR) for the storage cell; and computing a data retention time for the storage cell.

It is to be understood that both the foregoing general description and the following detailed description are exemplary only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
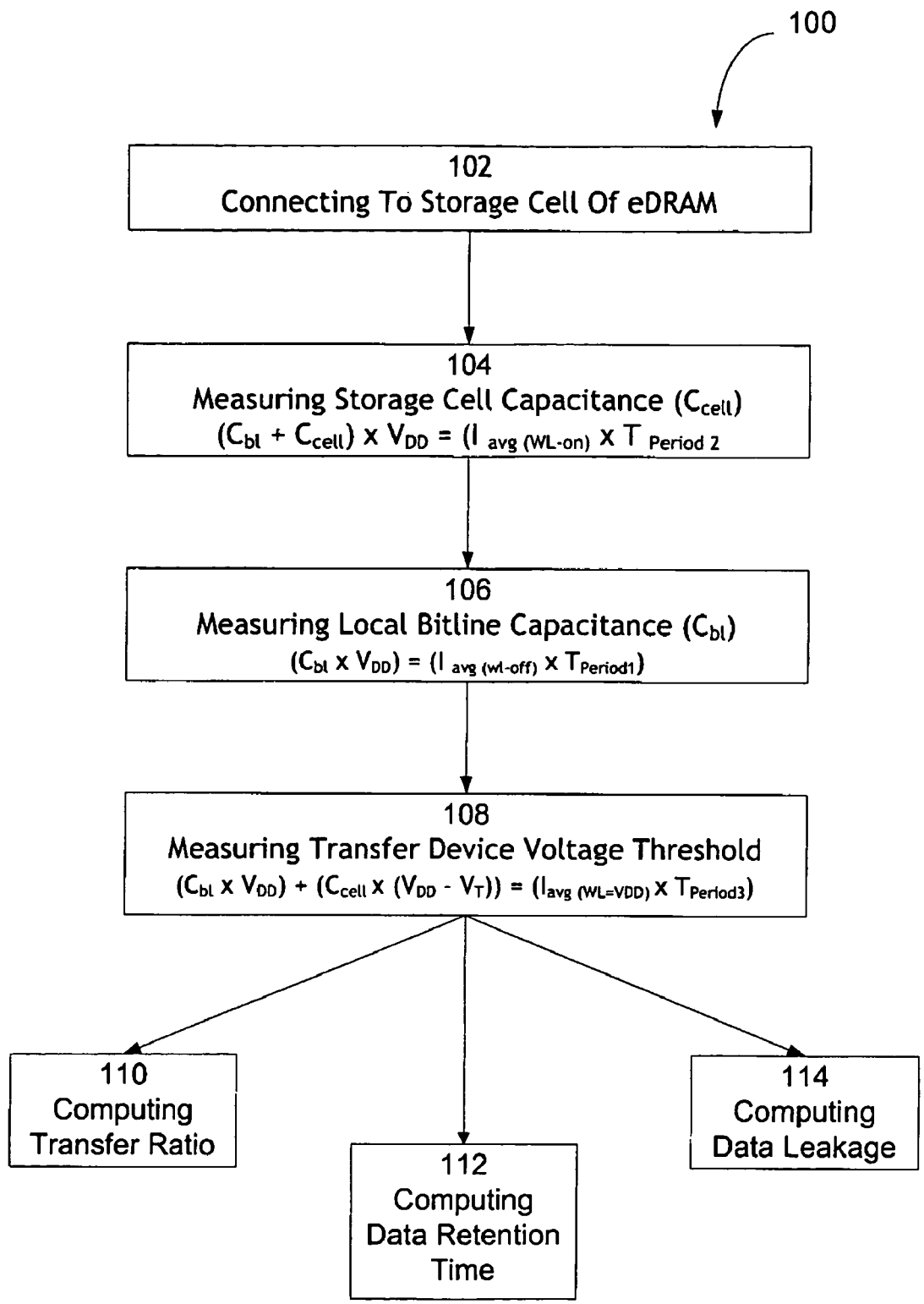
FIG. 1 is a flowchart illustrating a method of measuring statistics of DRAM parameters.

Referring generally to FIG. 1 a flowchart illustrating a method 100 for measuring statistics of dynamic random access memory (DRAM) process parameters in accordance with an exemplary embodiment of the present invention is shown. In a present embodiment, the method 100 includes sending a connection request 102 to a DRAM and specifically to a storage cell therein. The request then resulting in a connection to the storage cell requested. Upon establishing the connection the method includes measuring the storage cell capacitance ($C_{cell}$) 104. For example, the method of measuring the storage cell capacitance ($C_{cell}$) 104 may be performed by charge-based capacitance measurement techniques whereby the step of measuring the storage cell capacitance includes activating a corresponding word-line of the storage cell of the DRAM while simultaneously de-activating all other word-lines in the DRAM array. The selected word-line is driven by a voltage much higher than $V_{dd}$ to guarantee full $V_{dd}$ transition at the storage capacitance in a certain time-period. The local bitline and the selected storage cell capacitance are charged to a positive supply voltage ($V_{dd}$) by pulsing a corresponding write bitline (WBL) and discharged to ground by pulsing a corresponding read bitline (RBL). The capacitances are repeatedly charged and discharged and $C_{bl}+C_{cell}$ is measured from the average current drawn from the power $(C_{bl}+C_{cell}) \times V_{dd} = (I_{avg(WL-on)} \times T_{Period\,2})$. Here, Tperiod2 is the period of the pulses used to charge and discharge the capacitances. It should be chosen to allow full rail-to-rail transition at the bitline and the storage capacitance.

The method 100 further includes measuring a local bitline capacitance ($C_{bl}$) 106. For example, the method of measuring the bitline capacitance ($C_{bl}$) 106 cell capacitance may be performed by Charge-Based Capacitance Measurement techniques whereby the step of measuring the bitline capacitance includes de-activating all word-lines of the DRAM. The selected bitline is charged to a positive supply voltage ($V_{dd}$) by pulsing a corresponding write bitline (WBL). The local bitline is then discharged to ground by pulsing the corresponding read bitline (RBL) and the $C_{bl}$ is then measured from the average current drawn from the power usage ($C_{bl} \times V_{DD}) = (I_{avg(wl-off)} \times T_{Period1})$. Tperiod1 is the time period of the pulses used to charge and discharge the bitline and ensure full rail-to-rail transition.

The method 100 further includes the step of measuring the transfer device voltage threshold ($V_T$) 108 of the storage cell. In a present embodiment the $V_T$ of the transfer device is measured by driving the selected word-line to $V_{DD}$. The WBL and RBL are then pulsed and the average supply current is measured. The $V_T$ 108 is computed from the measured average current and the previously measured capacitances of $C_{bl}$ and $C_{cell}$. If the word-line is driven to $V_{dd}$, the $C_{bl}$ charges all the way to $V_{DD}$, while the $C_{cell}$ charges only up to $(V_{DD} - V_T)$. The frequency is selected to ensure full transition at $C_{bl}$ while $(V_{DD} - V_T)$ transition at the storage capacitance. Computation of the $V_T$ 108 from the measured average current and previously measured capacitances of $C_{bl}$ and $C_{cell}$ $(C_{bl} \times V_{DD}) + (C_{cell} \times (V_{DD} - V_T)) = (I_{avg(WL=VDD)} \times T_{Period3})$. Here Tperiod3 is time period of the pulses used to charge and discharge the bitline.

The method 100 further includes computing the transfer ratio (TR) 110. In a present embodiment the transfer ratio which determines the amount of signal developed on LBL during read operation is computed as $TR = C_{cell}/C_{cell} + C_{bl}$.

The method 100 further includes computing the leakage rate 114, data retention time 112, and access time, etc from circuit simulation, such as from SPICE (simulation program with integrated circuit emphasis) where the VT 110 of the transfer device, the storage cell capacitance 104, and the bitline capacitance 106, are known.

Figure 2:
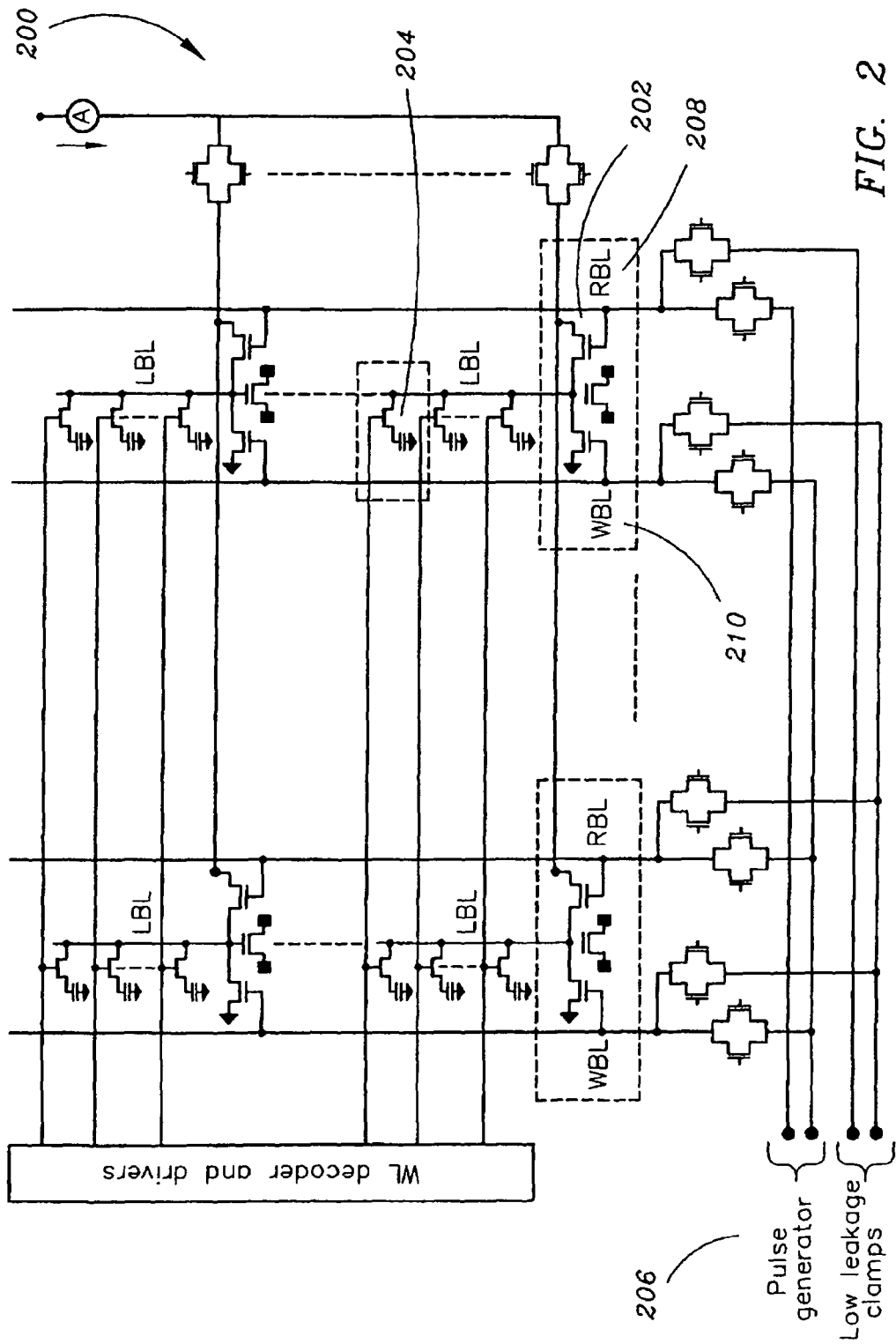
FIG. 2 is a circuit diagram illustrating a preferred embodiment of the present invention.

Referring generally to FIG. 2 is a circuit diagram illustrating a preferred embodiment of the present invention. Circuit 200 is comprised of a plurality of storage cells, wherein one storage cell 204 is identified for simplicity. A pulse generator 206 provides a charge to a micro sense amplifier 202. The micro sense amplifier 202 is used to charge and discharge the local bitline capacitance by pulsing a corresponding write bitline 210 and read bitline 208.

The micro sense amplifier is one particular implementation of the existing sense amplifier being used to charge and discharge the bitline and cell capacitance. In the present invention the micro sense amplifier is reconfigured for measurement. For example, the micro sense amplifier is reconfigured to open the connection of the source drain terminal where the read head device is connected to the WBL and RBL. In other embodiments of the present invention different micro sense amplifiers may require similar alterations to enable measurement processes. By using the existing sense amplifier devices there is no alteration of the bitline capacitance. Furthermore, using existing micro sense amplifier devices requires minimum perturbation in layout.

The present invention may take the form of an entirely hardware embodiment, an entirely software embodiment or an embodiment containing both hardware and software elements. Furthermore, the invention may take the form of a computer program product accessible from a computer-usable or computer-readable medium providing program code for use by or in connection with a computer or any instruction execution system. For the purposes of this description, a computer-usable or computer readable medium may be any apparatus that may contain, store, communicate, propagate, or transport the program for use by or in connection with the instruction execution system, apparatus, or device.

It is further contemplated that the medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages are to be understood by the foregoing description, and it is apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for measuring statistics of dynamic random access memory (DRAM) process parameters for an DRAM, comprising:
   selecting a storage cell of the DRAM;
   measuring a capacitance of the storage cell ($C_{cell}$);
   measuring a local bitline capacitance ($C_{bl}$) of the storage cell;
   measuring a transfer device voltage ($V_T$) of the storage cell; and
   simulating a storage cell of the DRAM according to the measured storage cell capacitance ($C_{cell}$), the local bitline capacitance ($C_{bl}$), and the transfer device voltage ($V_T$) to determine a data leakage, a data retention time, and a transfer ratio of the storage cell for DRAM design and production optimization.

2. The method as claimed in claim 1, wherein measuring the storage cell capacitance ($C_{cell}$) includes:
   activating a corresponding word-line of the storage cell of the DRAM;
   de-activating non-corresponding word lines of the DRAM;
   driving the selected word-line by a voltage value greater than positive supply voltage ($V_{dd}$)
   charging the local bitline and the storage cell to a positive supply voltage ($V_{dd}$);
   discharging the local bitline and the storage cell;
   repeating charging and discharging operations and computing the $C_{bl}+C_{cell}$ from a average current drawn from power usage.

3. The method as claimed in claim 1, wherein measuring the local bitline capacitance ($C_{bl}$) includes:
   de-activating all word-lines of the DRAM;
   charging the local bitline capacitance of the storage cell to a positive voltage $V_{dd}$;
   discharging the local bitline;
   repeating charging and discharging operations and measuring the $C_{bl}$ from the average current drawn from power usage.

4. The method as claimed in claim 1, wherein the transfer device voltage ($V_T$) of the storage cell is measured by:
   activating a corresponding word-line of the DRAM;
   de-activating non-corresponding word lines of the DRAM;
   driving the selected word-line by a voltage value equal to the positive supply voltage ($V_{dd}$)
   charging the local bitline capacitance to $V_{dd}$ and the cell storage capacitance to $V_{dd}-V_T$;
   repeating charging and discharging operations and measuring a average supply current; and
   measuring the $V_T$ from the average supply current and the measured $C_{bl}$ and $C_{cell}$ capacitances.

5. The method of claim 1, further comprising:
   configuring at least one of an existing sense amplifier device to charge and discharge capacitances during measurement of the storage cell capacitance (Ccell), the bitline capacitance (Cbl), and the transfer device voltage (VT) of the storage cell.

6. The method of claim 1, further comprising:
   computing a transfer ratio (TR) for the storage cell.

7. The method of claim 1, further comprising:
   computing a data retention time for the storage cell.

8. The method of claim 1, further comprising:
   computing a leakage rate for the storage cell.

9. A computer-readable medium having computer-executable instructions for performing a method for measuring statistics of random access memory (DRAM) process parameters, comprising:

selecting a storage cell of a DRAM;

measuring a capacitance of the storage cell ($C_{cell}$);

measuring a local bitline capacitance ($C_{bl}$); and measuring a transfer device voltage ($V_T$) of the storage cell; and simulating a storage cell of the DRAM according to the measured storage cell capacitance ($C_{cell}$), the local bitline capacitance ($C_{bl}$), and the transfer device voltage ($V_T$) to determine a data leakage, a data retention time, and a transfer ratio of the storage cell for DRAM design and production optimization.

10. The computer-readable medium as claimed in claim 9, wherein measuring the storage cell capacitance ($C_{cell}$) includes:

activating a corresponding word-line of the storage cell of the DRAM;

de-activating non-corresponding word lines of the DRAM;

charging a local bitline and the storage cell to a positive supply voltage ($V_{dd}$);

discharging the local bitline and the storage cell; and computing the $C_{cell}$ from a average current drawn from power usage.

11. The computer-readable medium as claimed in claim 9, wherein measuring the local bitline capacitance ($C_{bl}$) includes:

de-activating all word-lines of the DRAM;

charging the local bitline capacitance of the storage cell to $V_{dd}$;

discharging the local bitline; and measuring the $C_{bl}$ from the average current drawn from power usage.

12. The computer-readable medium as claimed in claim 9, wherein the transfer device voltage ($V_T$) of the storage cell is measured by selecting a word-line by $V_{dd}$;

charging the local bitline and the storage cell capacitance;

measuring a average supply current; and measuring the $V_T$ from the average supply current and the measured $C_{bl}$ and $C_{cell}$ capacitances.

13. The computer-readable medium as claimed in claim 9, further comprising:

computing a transfer ratio (TR) for the storage cell.

14. The computer-readable medium as claimed in claim 9, further comprising:

computing a data retention time for the storage cell.

15. The computer-readable medium as claimed in claim 9, further comprising:

computing a leakage rate for the storage cell.

16. A method for measuring statistics of dynamic random access memory (DRAM) process parameters for promoting optimized yield and performance of a DRAM, comprising:

charging a local bitline and a storage cell to a positive supply voltage ($V_{dd}$);

measuring a capacitance of the storage cell ($C_{cell}$);

measuring the local bitline capacitance ($C_{bl}$);

measuring the transfer device voltage ($V_T$) of the storage cell; and simulating a storage cell of the DRAM according to the measured storage cell capacitance ($C_{cell}$), the local bitline capacitance ($C_{bl}$), and the transfer device voltage ($V_T$) to determine a data leakage, a data retention time, and a transfer ratio of the storage cell for DRAM design and production optimization.

17. The method as claimed in claim 16, wherein measuring the storage cell capacitance ($C_{cell}$) includes:

activating a corresponding word-line of the storage cell of the DRAM;

de-activating non-corresponding word lines of the DRAM;

charging a local bitline and the storage cell to a positive supply voltage ($V_{dd}$);

discharging the local bitline and the storage cell; and computing the $C_{cell}$ from a average current drawn from power usage.

18. The method as claimed in claim 16, wherein measuring the local bitline capacitance ($C_{bl}$) includes:

de-activating all word-lines of the DRAM;

charging the local bitline capacitance of the storage cell to $V_{dd}$;

discharging the bitline; and measuring the $C_{bl}$ from the average current drawn from power usage.

19. The method as claimed in claim 16, wherein the transfer device voltage ($V_T$) of the storage cell is measured by selecting a word-line by $V_{dd}$;

charging the local bitline and the storage cell capacitance;

measuring a average supply current; and measuring the $V_T$ from the average supply current and the measured $C_{bl}$ and $C_{cell}$ capacitances.

20. The method as claimed in claim 16, further comprising:

configuring at least one of an existing sense amplifier device to charge and discharge capacitances during measurement of the storage cell capacitance ($C_{cell}$), the bitline capacitance ($C_{bl}$), and the transfer device voltage ($V_T$) of the storage cell.

* * * * *